United States Patent
Mao et al.

(10) Patent No.: US 12,490,548 B2
(45) Date of Patent: Dec. 2, 2025

(54) PHOTOVOLTAIC CELL AND PHOTOVOLTAIC MODULE

(71) Applicants: ZHEJIANG JINKO SOLAR CO., LTD., Zhejiang (CN); JINKO SOLAR CO., LTD., Jiangxi (CN)

(72) Inventors: Jie Mao, Zhejiang (CN); Zhao Wang, Zhejiang (CN); Peiting Zheng, Zhejiang (CN); Jie Yang, Zhejiang (CN); Xinyu Zhang, Zhejiang (CN)

(73) Assignees: ZHEJIANG JINKO SOLAR CO., LTD., Haining (CN); JINKO SOLAR CO., LTD., Jiangxi (CN)

( * ) Notice: Subject to any disclaimer, the term of this patent is extended or adjusted under 35 U.S.C. 154(b) by 142 days.

(21) Appl. No.: 18/470,386

(22) Filed: Sep. 19, 2023

(65) Prior Publication Data

US 2024/0088312 A1    Mar. 14, 2024

Related U.S. Application Data

(63) Continuation of application No. 17/960,687, filed on Oct. 5, 2022, now Pat. No. 11,791,426.

(30) Foreign Application Priority Data

Sep. 8, 2022   (CN) .......................... 202211098196.3

(51) Int. Cl.
*H10F 77/70*    (2025.01)
*H10F 71/00*    (2025.01)
(Continued)

(52) U.S. Cl.
CPC ......... *H10F 77/703* (2025.01); *H10F 71/129* (2025.01); *H10F 77/315* (2025.01)

(58) Field of Classification Search
CPC ..... H10F 77/703; H10F 71/129; H10F 77/315
See application file for complete search history.

(56) References Cited

U.S. PATENT DOCUMENTS 11,581,454 B1 *  2/2023  Yu ......................... H10F 77/703
2010/0065117 A1   3/2010  Kim et al.
(Continued)

FOREIGN PATENT DOCUMENTS

AU         2021225144 B1    6/2022
CN           104409571 A    3/2015
(Continued)

OTHER PUBLICATIONS

Zhejiang Jinko Solar Co., Ltd., et al., Non-Final Rejection, U.S. Appl. No. 18/051,878, Oct. 5, 2023, 15 pgs.
(Continued)

*Primary Examiner* — Jayne L Mershon
(74) *Attorney, Agent, or Firm* — USCH Law, PC

(57) ABSTRACT

A photovoltaic cell is provided, including a substrate having a front surface with metal pattern regions and a rear surface, first pyramid structures in each metal pattern region, platform protrusion structures on the rear surface, a first tunneling layer and a first doped conductive layer on a portion of the front surface in a respective metal pattern region, and a second tunneling layer and a second doped conductive layer on the rear surface. A height of each first pyramid structure is greater than that of each platform protrusion structure. A one-dimensional dimension of a bottom portion of each first pyramid structure is less than that of each platform protrusion structure. A doping element type of the first doped conductive layer is the same as that of the substrate. A doping element type of the second doped conductive layer is different from that of the first doped conductive layer.

20 Claims, 4 Drawing Sheets

(51) Int. Cl.
  *H10F 71/10* (2025.01)
  *H10F 77/30* (2025.01)

(56) References Cited

U.S. PATENT DOCUMENTS

| | | | |
|---|---|---|---|
| 2011/0277816 A1* | 11/2011 | Xu | H10F 77/48 |
| | | | 136/246 |
| 2012/0090673 A1 | 4/2012 | Dimitrov et al. | |
| 2013/0048073 A1 | 2/2013 | Karakida | |
| 2015/0280048 A1 | 10/2015 | Jeong et al. | |
| 2016/0276515 A1 | 9/2016 | Chang et al. | |
| 2017/0179325 A1 | 6/2017 | Chung et al. | |
| 2019/0157497 A1 | 5/2019 | Yoon et al. | |
| 2020/0135944 A1* | 4/2020 | Yi | H10F 10/14 |
| 2020/0287066 A1 | 9/2020 | Stodolny et al. | |
| 2020/0350445 A1 | 11/2020 | Cheong et al. | |
| 2021/0399150 A1 | 12/2021 | Hilali et al. | |
| 2022/0102568 A1 | 3/2022 | Yang et al. | |
| 2022/0209031 A1* | 6/2022 | Breus | H10F 71/121 |
| 2023/0369530 A1* | 11/2023 | Buchholz | H10F 71/1221 |

FOREIGN PATENT DOCUMENTS

| | | |
|---|---|---|
| CN | 205194713 U | 4/2016 |
| CN | 105826411 A | 8/2016 |
| CN | 110610998 A | 12/2019 |
| CN | 111146311 A | 5/2020 |
| CN | 112201701 A | 1/2021 |
| CN | 112885924 A | 6/2021 |
| CN | 113078232 A | 7/2021 |
| CN | 214043687 U | 8/2021 |
| CN | 113964241 A | 1/2022 |
| CN | 114497241 A | 5/2022 |
| CN | 114512551 A | 5/2022 |
| CN | 114613865 A | 6/2022 |
| CN | 114613867 A | 6/2022 |
| CN | 114784148 A | 7/2022 |
| CN | 114823951 A | 7/2022 |
| CN | 216871997 U | 7/2022 |
| CN | 217306521 U | 8/2022 |
| DE | 102021000501 A1 | 8/2022 |
| EP | 2704214 B1 | 10/2018 |
| EP | 3979336 A1 | 4/2022 |
| JP | 2012129533 A | 7/2012 |
| JP | 2012164712 A | 8/2012 |
| JP | 2014082285 A | 5/2014 |
| JP | 2014192370 A | 10/2014 |
| JP | 2014238969 A | 12/2014 |
| JP | 2015531550 A | 11/2015 |
| JP | 2017112379 A | 6/2017 |
| JP | 2017126748 A | 7/2017 |
| JP | 2017130664 A | 7/2017 |
| JP | 2018082157 A | 5/2018 |
| JP | 2018085509 A | 5/2018 |
| JP | 2019068108 A | 4/2019 |
| JP | 2022058069 A | 4/2022 |
| JP | 2022081366 A | 5/2022 |
| KR | 20140003669 A | 1/2014 |
| KR | 101740523 B1 | 5/2017 |
| KR | 1020170073480 A | 6/2017 |
| KR | 20210067386 A | 6/2021 |
| WO | 2013161373 A1 | 10/2013 |
| WO | 2014162979 A1 | 10/2014 |
| WO | 2016163168 A1 | 10/2016 |
| WO | 2017002927 A1 | 1/2017 |

OTHER PUBLICATIONS

Zhejiang Jinko Solar Co., Ltd et al., Examination report No. 1 for your standard patent application, AU 2022263498, Oct. 19, 2023, 9 pgs.
Zheng Jingming, et al., "Blistering-free polycrystalline silicon carbide films for double-sided passivating contact solar cells", Solar Energy Materials and Solar Cells, vol. 238, May 2022, 10 pgs.
Ghosh Dibyendu Kumar, et al., "Fundamentals, present status and future perspective of TOPCon solar cells: A comprehensive review", Surfaces and Interfaces, vol. 30, Jun. 2022, 38 pgs.
Zhejiang Jinko Solar Co., Ltd., et al., JP Notice of Reasons for Refusal with English translation, JP 2023-215735, Jul. 1, 2024, 13 pgs.
Zhejiang Jinko Solar Co., Ltd., et al., KR First Office Action with English translation , KR 10-2023-0097826, Jun. 18, 2024, 17 pgs.
Zhejiang Jinko Solar Co., Ltd., et al., Examination report No. 1 for standard patent application, AU 2023258334, Sep. 23, 2024, 3 pgs.
Zhejiang Jinko Solar Co., Ltd., et al., Notice of Reason for Refusal, JP 2023-215735, Mar. 1, 2024, 10 pgs.
Zhejiang Jinko Solar Co., Ltd., et al., Notice-of-Allowance, U.S. Appl. No. 17/960,687, Jun. 1, 2023, 9 pgs.
Zhejiang Jinko Solar Co., Ltd., et al., Extended European Search Report, EP 22199634.1, Jul. 5, 2023, 7 pgs.
Zhejiang Jinko Solar Co., Ltd., et al., Notice-of-Allowance, U.S. Appl. No. 17/960,711, Jul. 6, 2023, 11 pgs.
Zhejiang Jinko Solar Co., Ltd., et al., Extended European Search Report, EP 22199678.8, Aug. 18, 2023, 6 pgs.
Zhejiang Jinko Solar Co., Ltd., et al., Extended European Search Report, EP 22204989.2, Aug. 24, 2023, 7 pgs.
Peibst Robby, et al., "For None, One, or Two Polarities—How Do Polo Junctions Fit Best Into Industrial Si Solar Cells?", Progress in Photovoltaics: Research and Applications, vol. 28, No. 6, Hoboken, USA, ISSN:1062-7995, DOI:10.1002/PIP.3201, Jun. 1, 2020, 14 pgs.
Haase F, et al., "Cells and Modules With Passivating Contacts—Polo Technology", May 9, 2019, 13 pgs. Retrieved From the Internet: URL:https://16iwy1195vvfgoqu3136p21y-wpengine.netdna-ssl.com/wp-content/uploads/2019/04/20190509_Webinar-PERC-and-beyond_Haase.pdf.
Charles Seron, et al., "Hydrogenation of Sputtered ZnO: Al Layers for Double Side Poly-Si/SiOx Integration", 38th European Photovoltaic Solar Energy Conference and Exhibition, Sep. 10, 2021, 4 pgs.
E. Saugar, et al., "Laser-Induced Crystallization of Sputtered Unhydrogenated Silicon at Low Temperatures", 33rd European Photovoltaic Solar Energy Conference and Exhibition: Proceedings of the International Conference, Sep. 2017, 5 pgs.
Zhejiang Jinko Solar Co., Ltd., et al., Notice of acceptance for your patent application, AU 2022246370, Aug. 29, 2023, 4 pgs.
Zhejiang Jinko Solar Co., Ltd., et al., Notice of acceptance for your patent application, AU 2022246372, Sep. 11, 2023, 4 pgs.

* cited by examiner

PHOTOVOLTAIC CELL AND PHOTOVOLTAIC MODULE

CROSS-REFERENCE TO RELATED APPLICATION

The present application is a continuation of U.S. patent application Ser. No. 17/960,687, filed on Oct. 5, 2022, which claims the benefit of priority under the Paris Convention to Chinese Patent Application No. 202211098196.3 filed on Sep. 8, 2022, each of which is incorporated by reference herein in its entirety.

TECHNICAL FIELD

Embodiments of the present disclosure relate in general to photovoltaic cell technology, and more particularly to a photovoltaic cell and a photovoltaic module.

BACKGROUND

Photovoltaic cells have good photoelectric conversion capabilities. Generally, texture treatment needs to be performed first in the process of preparing a photovoltaic cell, so that a front surface and a rear surface of a substrate have a texture structure. The texture structure has an important influence on absorption of incident light of the substrate, uniformity of film layers subsequently deposited on the substrate and contact performance with an interface of the substrate, thereby further affecting photoelectric conversion performance of the photovoltaic cell.

However, conventional photovoltaic cells have low photoelectric conversion efficiency.

SUMMARY

Some embodiments of the present disclosure provide a photovoltaic cell and a photovoltaic module, which are at least conducive to improving photoelectric conversion efficiency of the photovoltaic cell.

Some embodiments of the present disclosure provide a photovoltaic cell including: a substrate having a front surface and a rear surface opposite to each other, wherein the front surface of the substrate has a plurality of metal pattern regions; a plurality of first pyramid structures disposed in each of the plurality of metal pattern regions; a plurality of platform protrusion structures disposed on the rear surface of the substrate, wherein a height of each of the plurality of first pyramid structures is greater than a height of each of the plurality of platform protrusion structures, and a one-dimensional dimension of a bottom portion of each of the plurality of first pyramid structures is less than a one-dimensional dimension of a bottom portion of each of the plurality of the platform protrusion structures; a first tunneling layer and a first doped conductive layer stacked on a portion of the front surface of the substrate in a respective metal pattern region in a direction away from the substrate, wherein a doping element type of the first doped conductive layer is the same as a doping element type of the substrate; and a second tunneling layer and a second doped conductive layer stacked on the rear surface of the substrate in a direction away from the substrate, wherein a doping element type of the second doped conductive layer is different from the doping element type of the first doped conductive layer.

In some embodiments, the one-dimensional dimension of the bottom portion of each of the plurality of first pyramid structures is in a range of 0.7 μm to 3 μm, and a height from top to bottom of each of the plurality of first pyramid structures is in a range of 0.5 μm to 3.2 μm.

In some embodiments, an included angle between a respective one of bevel edges of a respective first pyramid structure and a bottom portion of the respective first pyramid structure is in a range of 30° to 70°.

In some embodiments, a length of each of the bevel edges of the respective first pyramid structure is in a range of 1.2 μm to 2.5 μm.

In some embodiments, the one-dimensional dimension of the bottom portion of each of the plurality of platform protrusion structures is in a range of 6 μm to 10 μm, and a height from top to bottom of each of the plurality of platform protrusion structures is in a range of 0.2 μm to 0.4 μm.

In some embodiments, an included angle between a respective one of bevel edges of a respective platform protrusion structure and a bottom portion of the respective platform protrusion structure is in a range of 10° to 50°.

In some embodiments, a length of each of the bevel edges of the respective platform protrusion structure is in a range of 0.3 μm to 2.3 μm.

In some embodiments, the photovoltaic cell further includes a plurality of second pyramid structures disposed in each of the plurality of metal pattern regions, wherein an area proportion of the plurality of first pyramid structures on a portion of the front surface of the substrate in a respective metal pattern region is greater than an area proportion of the plurality of second pyramid structures on the portion of the front surface of the substrate in the respective metal pattern region, and an included angle between a respective one of bevel edges of a respective second pyramid structure and a bottom portion of the respective second pyramid structure is in a range of 40° to 70°.

In some embodiments, a one-dimensional dimension of a bottom portion of each of the plurality of second pyramid structures is not greater than 1 μm, and a height from top to bottom of each of the plurality of second pyramid structures is not greater than 1.2 μm.

In some embodiments, the front surface of the substrate has a plurality of non-metal pattern regions, and the photovoltaic cell further includes a plurality of third pyramid structures and a plurality of fourth pyramid structures disposed in each of the plurality of non-metal pattern regions, wherein a dimension of a bottom portion of each of the plurality of third pyramid structures is greater than a dimension of a bottom portion of each of the plurality of fourth pyramid structures, an area proportion of the plurality of third pyramid structures on a portion of the front surface of the substrate in a respective non-metal pattern region is less than the area proportion of the plurality of first pyramid structures on the portion of the front surface of the substrate in the respective metal pattern region.

In some embodiments, an included angle between a respective one of bevel edges of a respective third pyramid structure and a bottom portion of the respective third pyramid structure is in a range of 35° to 65°, and an included angle between a respective one of bevel edges of a respective fourth pyramid structure and a bottom portion of the respective fourth pyramid structure is in a range of 40° to 65°.

In some embodiments, a length of each of the bevel edges of the respective third pyramid structure is in a range of 1.2 μm to 2.5 μm, and a length of each of the bevel edges of the respective fourth pyramid structure is in a range of 0.5 μm to 1.2 μm.

In some embodiments, a reflectivity of the portion of the front surface of the substrate in the respective non-metal pattern region is in a range of 0.8% to 2%, and a reflectivity of the rear surface of the substrate is in a range of 14% to 15%.

In some embodiments, a first passivation layer, wherein a first portion of the first passivation layer is disposed on a surface of the first doped conductive layer away from the substrate, and a second portion of the first passivation layer is disposed on the portion of the front surface of the substrate in the respective non-metal pattern region.

In some embodiments, the first portion of the first passivation layer is not flush with the second portion of the first passivation layer.

In some embodiments, the photovoltaic cell further includes a second passivation layer disposed on a surface of the second doped conductive layer away from the substrate.

In some embodiments, the photovoltaic cell further includes a first electrode disposed in the respective metal pattern region and electrically connected to the first doped conductive layer.

In some embodiments, the photovoltaic cell further includes a diffusion region disposed inside a portion of the substrate in the respective metal pattern region, wherein a top portion of the diffusion region is in contact with the first tunneling layer, and a doping element concentration of the diffusion region is greater than a doping element concentration of the substrate.

In some embodiments, the substrate includes an N-type silicon substrate.

Some embodiments of the present disclosure provide a photovoltaic module including: at least one cell string, each of the at least one cell string formed by a plurality of photovoltaic cells according to the above embodiments which are electrically connected; at least one encapsulation layer, each of the at least one encapsulation layer configured to cover a surface of a respective cell string; and at least one cover plate, each of the at least one cover plate configured to cover a surface of a respective encapsulation layer facing away from the respective cell string.

BRIEF DESCRIPTION OF THE DRAWINGS

One or more embodiments are described as examples with reference to the corresponding figures in the accompanying drawings, and the examples do not constitute a limitation to the embodiments. The figures in the accompanying drawings do not constitute a proportion limitation unless otherwise stated.

DETAILED DESCRIPTION OF THE EMBODIMENTS

Figure 1:
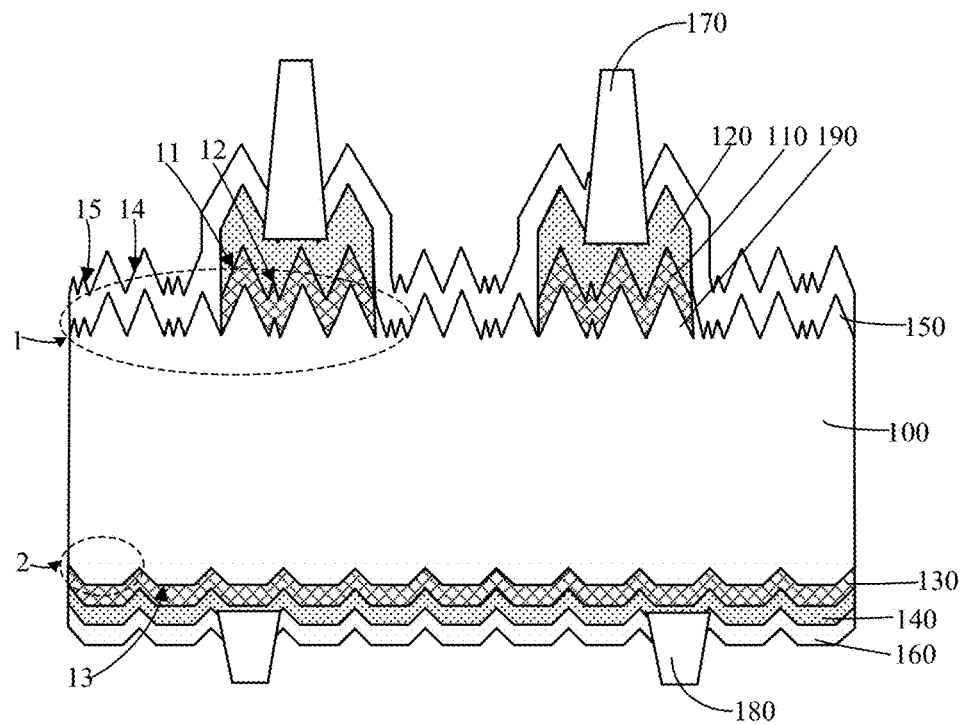
FIG. 1 is a schematic cross-sectional view of a photovoltaic cell according to an embodiment of the present disclosure.
Figure 2:
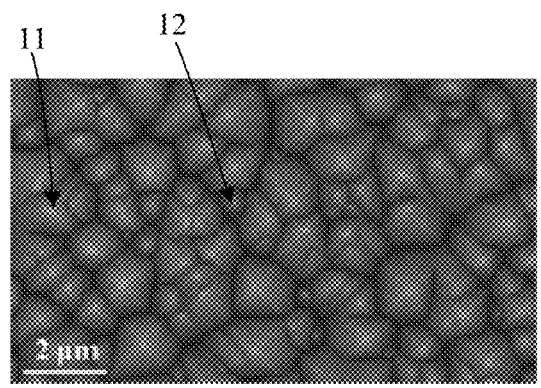
FIG. 2 is a scanning electron microscopy (SEM) structure graph from a top view of a portion of a front surface of a substrate in a metal pattern region in a photovoltaic cell according to an embodiment of the present disclosure.
Figure 3:
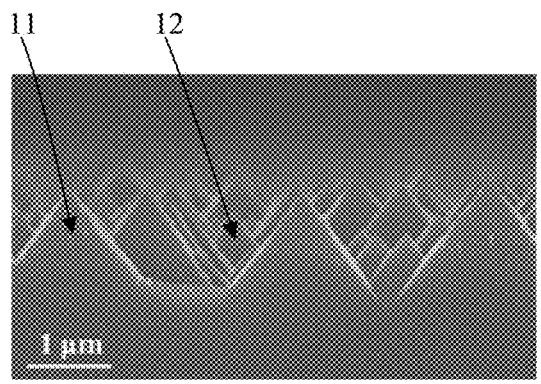
FIG. 3 is a SEM structure graph from a side view of a portion of a front surface of a substrate in a metal pattern region in a photovoltaic cell according to an embodiment of the present disclosure.

It is seen from BACKGROUND that, generally, conventional photovoltaic cells have low photoelectric conversion efficiency.

It is found that reasons for the low photoelectric conversion efficiency of the conventional photovoltaic cells are at least the following. First, a diffusion process is usually used to convert a portion of a substrate to an emitter on a front surface of the substrate, and doping elements in the emitter are of different types from those in the substrate such that the emitter forms a PN junction with an undiffused portion of the substrate. However, this kind of structure causes carrier recombination of a portion of the front surface of the substrate in a metal pattern region to be too large, thereby affecting an open-circuit voltage and conversion efficiency of the photoelectric cell. Secondly, in the conventional photovoltaic cells, the texture structures on the front surface of the substrate and the rear surface of the substrate greatly affect the incident light and the quality of the film layers deposited on the surface of the substrate, and utilization of the incident light and the performance of the film layers play an important role in the photoelectric conversion performance of the photovoltaic cell.

In the photovoltaic cell provided in the embodiments of the present disclosure, a plurality of first pyramid structures are provided in each of a plurality of metal pattern regions of a front surface of a substrate, a plurality of platform protrusion structures are disposed on a rear surface of the substrate, a height of each first pyramid structure is greater than a height of each platform raised structure, and a dimension of a bottom portion of each first pyramid structure is less than a dimension of a bottom portion of each second pyramid structure. In this way, the roughness of the front surface is greater than the roughness of the rear surface, so that a reflectivity of the incident light on the front surface is less than a reflectivity of the incident light on the rear surface. On the one hand, the absorption of the incident light by the front surface is enhanced. On the other hand, in order to reduce parasitic absorption of the incident light by a first doped conductive layer, a first tunneling layer and the first doped conductive layer are formed only in the metal pattern region. Based on this, the roughness of a portion of the front surface of the substrate in the metal pattern region is relatively great, and a contact area between the first tunneling layer and the front surface of the substrate and a contact area between the first doped conductive layer and the front surface of the substrate are increased, so as to provide a large tunneling channel for carriers in the substrate, thereby improving utilization of the incident light by the substrate without reducing the mobility of carriers. In addition, since the second doped conductive layer and the substrate form a PN junction, the roughness of the rear surface is relatively small, so that the second tunneling layer and the second doped conductive layer disposed on the rear surface have greater flatness. Thus, a contact interface between the second tunneling layer and the rear surface of the substrate has a good morphology, the defect state density of the rear surface of the substrate is reduced, and a probability of recombination of photogenerated carriers on the rear surface of the substrate is reduced, so that the mobility of the photogenerated carriers to the substrate is increased, which is conducive to improving a concentration of the carriers, thereby improving photoelectric conversion performance of the photovoltaic cell.

Various embodiments of the present disclosure are described in detail below with reference to the accompanying drawings. Those of ordinary skill in the art should appreciate that many technical details have been proposed in various embodiments of the present disclosure for the better understanding of the present disclosure. However, the technical solutions claimed in the present disclosure are able to be realized even without these technical details and various changes and modifications based on the following embodiments.

FIG. 1 is a schematic cross-sectional view of a photovoltaic cell according to an embodiment of the present disclosure.

Referring to FIG. 1, the photovoltaic cell includes a substrate 100 having a front surface and a rear surface opposite to each other, the front surface of the substrate 100 having a plurality of metal pattern regions, a plurality of first pyramid structures 11 disposed in each of the plurality of metal pattern regions, a plurality of platform protrusion structures 13 disposed on the rear surface of the substrate 100, a first tunneling layer 110 and a first doped conductive layer 120 stacked on a portion of the front surface of the substrate 100 in a respective metal pattern region in a direction away from the substrate 100, and a second tunneling layer 130 and a second doped conductive layer 140 stacked on the rear surface of the substrate 100 in a direction away from the substrate 100. A height of each of the plurality of first pyramid structures 11 is greater than a height of each of the plurality of platform protrusion structures 13, and a one-dimensional dimension of a bottom portion of each of the plurality of first pyramid structures 11 is less than a one-dimensional dimension of a bottom portion of each of the plurality of the platform protrusion structures 13. A doping element type of the first doped conductive layer 120 is the same as a doping element type of the substrate 100. A doping element type of the second doped conductive layer 140 is different from the doping element type of the first doped conductive layer 120.

In the embodiments of the present disclosure, dimensions and shapes of the texture structures (i.e., the pyramid structures) on the portion of the front surface of the substrate 100 in the metal pattern region are different so that the roughness of the front surface of the substrate 100 is greater than the roughness of the rear surface. On the one hand, the reflectivity of the incident light on the front surface of the substrate 100 is smaller than the reflectivity of the incident light on the rear surface of the substrate 100, so that the absorption and utilization of the incident light by the front surface of the substrate 100 are enhanced.

On the other hand, in order to reduce the parasitic absorption of the incident light by the first doped conductive layer 120, the first tunneling layer 110 and the first doped conductive layer 120 are formed only in the metal pattern region. Based on this, the roughness of the portion of the front surface of the substrate 100 in the metal pattern region is large, so that a specific surface area of the texture structure on the portion of the front surface of the substrate 100 in the metal pattern area is large. In this way, the contact area between the first tunneling layer 110 and the front surface of the substrate 100 and the contact area between the first doped conductive layer 120 and the front surface of the substrate 100 are increased. It should be understood that the first tunneling layer 110 and the first doped conductive layer 120 have passivation effects, which are able to reduce the defect state density at the interface of the surface of the substrate 100, so that carriers in the substrate 100 is able to be tunneled into the first doped conductive layer 120 through a contact interface between the first tunneling layer 110 and the substrate 100 to achieve selective transmission of the carriers. It is seen that the tunneling channel of the carriers from the substrate 100 to the first doped conductive layer 120 is increased by increasing the contact area between the first tunneling layer 110 and the substrate 100, so that the transmission efficiency of the carriers is improved, the concentration of carriers in the first doped conductive layer 120 is increased, and the short-circuit current and the open-circuit voltage are increased, thereby improving the utilization of the incident light by the substrate 100 while greatly reducing the mobility of the carriers.

In addition, since the second doped conductive layer 140 forms the PN junction with the substrate 100, the PN junction is configured to generate photogenerated carriers, and the generated photogenerated carriers are transmitted into the substrate 100 and then transmitted from the substrate 100 into the first doped conductive layer 120. Therefore, the roughness of the rear surface is configured to be small, so that the second tunneling layer 130 and the second doped conductive layer 140 provided on the rear surface have greater flatness, thus the contact interface between the second tunneling layer 130 and the rear surface of the substrate 100 has a good morphology. In this way, the defect state density of the rear surface of the substrate 100 is reduced, and the probability of the recombination of the photogenerated carriers generated by the PN junction on the rear surface of the substrate 100 is reduced, so that the mobility of the photogenerated carriers to the substrate 100 is improved, which is conducive to improving the concentration of the carriers, thereby improving photoelectric conversion performance of the photovoltaic cell.

The substrate 100 is configured to receive the incident light and generate the photogenerated carriers. In some embodiments, the substrate 100 may be a silicon substrate, and a material of the silicon substrate may include at least one of monocrystalline silicon, polysilicon, amorphous silicon, and microcrystalline silicon. In some embodiments, the material of the substrate 100 may also be silicon carbide, an organic material, or multicomponent compounds. The multicomponent compounds include, but are not limited to, materials such as perovskite, gallium arsenide, cadmium telluride, copper indium selenium, and the like.

In some embodiments, the substrate 100 has doping elements, and a type of the doping elements includes N-type or P-type. The N-type elements may be group V elements such as phosphorus (P), bismuth (Bi), antimony (Sb), arsenic (As), or the like. The P-type elements may be group III elements such as boron (B), aluminum (Al), gallium (Ga), indium (In), or the like. For example, when the substrate 100 is a P-type substrate, the type of the doping elements in the substrate 100 is P-type. In some embodiments, when the substrate 100 is an N-type substrate, the type of the doping elements in the substrate 100 is N-type.

Specifically, in some embodiments, the substrate 100 is an N-type silicon substrate. Based on this, the first doped conductive layer 120 may be provided as an N-type doped conductive layer, and the second doped conductive layer 140 may be provided as a P-type doped conductive layer. The P-type second doped conductive layer 140 forms a PN junction with the N-type substrate 100, thereby forming a rear junction (i.e., the PN junction formed on the rear surface of the substrate 100).

In some embodiments, the substrate 100 may also be a P-type silicon semiconductor substrate, the first doped conductive layer 120 is a P-type doped conductive layer, and the second doped conductive layer 140 is an N-type doped conductive layer.

Both the front and rear surfaces of the substrate 100 may be configured to receive incident or reflected light. The first tunnel layer 110 and the first doped conductive layer 120 on the front surface of the substrate 100 are configured to constitute a passivation contact structure on the front surface of the substrate 100, and the second tunnel layer 130 and the second doped conductive layer 140 on the rear surface of the substrate 100 are configured to constitute a passivation contact structure on the rear surface of the substrate 100. The passivation contact structures are respectively provided on the front surface and the rear surface of the substrate 100 so that the photovoltaic cell is formed as a double-sided tunnel oxide passivated contact (TOPCON) cell. In this way, the passivation contact structures formed on the front surface and the rear surface of the substrate 100 are capable of reducing carrier recombination on both the front surface and the rear surface of the substrate 100, which greatly reduces loss of the carriers of the photovoltaic cell as compared with forming the passivation contact structure on only one surface of the substrate 100, thereby increasing an open-circuit voltage and a short-circuit current of the photovoltaic cell. In the embodiments of the present disclosure, the first tunneling layer 110 and the first doped conductive layer 120 are disposed only on the portion of the front surface of the substrate 100 in the metal pattern region, so that the parasitic absorption of the incident light by the first doped conductive layer 120 is reduced, and the absorption and utilization of the incident light in the non-metal pattern region are improved.

By forming the passivation contact structures, the recombination of the carriers on the surface of the substrate 100 is reduced, so that the open-circuit voltage of the photovoltaic cell is increased, and thus improving the photoelectric conversion efficiency of the photovoltaic cell.

The first tunneling layer 110 and the second tunneling layer 130 are configured to achieve interface passivation of the surface of the substrate 100, which realizes a chemical passivation effect. Specifically, state density of the interface defects of the surface of the substrate 100 is reduced by saturating suspension bonds of the surface of the substrate 100, thereby reducing recombination centers of the surface of the substrate 100. The presence of the first tunneling layer 110 and the second tunneling layer 130 allows the majority of carriers to be tunneled through the surface of the substrate 100 into the substrate 100, thereby enabling selective transmission of the carrier. Specifically, the majority of carriers to be tunneled through a contact interface between the first tunneling layer 110 and the substrate 100 and a contact interface between the second tunneling layer 130 and the substrate 100 into the substrate 100.

In the embodiments of the present disclosure, the first pyramid structures 11 are provided in the metal pattern region of the front surface of the substrate 100, and the platform protrusion structures 13 are disposed on the rear surface of the substrate 100. In this way, the roughness of the front surface is greater than the roughness of the rear surface, so that the mobility of carriers in the first tunneling layer 110 is not reduced while improving the utilization of the incident light by the substrate 100. The roughness of the rear surface is configured to be small, so that the second tunneling layer 130 and the second doped conductive layer 140 provided on the rear surface have greater flatness, and the probability of the recombination of the photogenerated carriers generated by the PN junction on the rear surface of the substrate 100 is reduced, thereby improving the mobility of the photogenerated carriers to the substrate 100. That is, the photoelectric conversion performance of the photovoltaic cell is improved as a whole by providing the texture structure on the front surface to match the film layer structure on the front surface of the substrate 100 and providing the texture structure on the rear surface of the substrate 100 to match the film layer structure on the rear surface of the substrate 100.

The number of the first pyramid structures 11 and the number of the second pyramid structures 12 on the portion of the front surface of the substrate 100 in the metal pattern region are plural. There may be slight dimensional differences between different first pyramid structures 11 and between different second pyramid structures 12, but an overall dimension of each first pyramid structure 11 is approximately close, and an overall dimension of each second pyramid structure 12 is approximately close. In should be noted that the dimensions of the plurality of first pyramid structures 11 and the plurality of second pyramid structures 12 are average dimensions within a sampling region.

In some embodiments, the dimension of the bottom portion of the first pyramid structure 11 is in a range of 0.7 μm to 3 μm, such as 0.7 μm~0.9 μm, 0.9 μm~1 μm, 1 μm~1.2 μm, 1.2 μm~1.4 μm, 1.4 μm~1.5 μm, 1.5 μm~1.7 μm, 1.7 μm~1.9 μm, 1.9 μm~2 μm, 2 μm~2.3 μm, 2.3 μm~2.5 μm, 2.5 μm~2.8 μm, 2.8 μm~3 μm, or the like. The height from top to bottom of the first pyramid structure 11 is in a range of 0.5 μm to 3.2 μm, such as 0.5 μm~0.7 μm, 0.7 μm~0.8 μm, 0.8 μm~1 μm, 1 μm~1.2 μm, 1.2 μm~1.5 μm, 1.5 μm~1.7 μm, 1.7 μm~1.9 μm, 1.9 μm~2 μm, 2 μm~2.2 μm, 2.2 μm~2.4 μm, 2.4 μm~2.6 μm, 2.6 μm~2.9 μm, 2.9 μm~3.2 μm, or the like. Within this range, not only the roughness of the portion of the front surface of the substrate 100 in the metal pattern region is increased, but also the number of the first pyramid structures 11 is reduced while keeping the area proportion of the first pyramid structures 11 unchanged, so that dimensional unevenness caused by slight dimensional differences between different first pyramid structures 11 is reduced.

Figure 5:
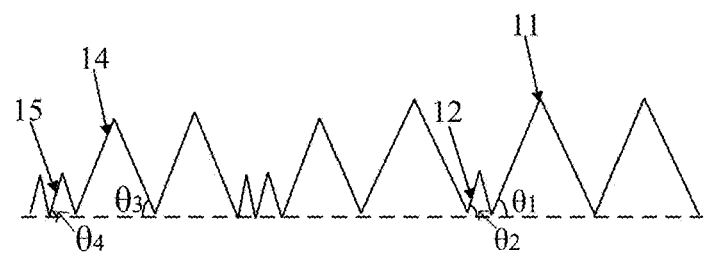
FIG. 5 is an enlarged view of '1' shown in FIG. 1.

Referring to FIG. 5, in some embodiments, an included angle $\theta_1$ between a respective one of bevel edges of a respective first pyramid structure 11 and a bottom portion of the respective first pyramid structure 11 is in a range of 30° to 70°, such as 30°~35°, 35°~40°, 40°~45°, 45°~50°, 50°~55°, 55°~60°, 60°~65°, 65°~70°, or the like. Within this range, the bevel edges of the respective first pyramid structure 11 are less inclined with respect to the bottom portion of the respective first pyramid structure 11, so that the portion of the front surface of the substrate 100 on which the first pyramid structures 11 are disposed has large roughness, thus the uniformity of the first tunneling layer 110 and the first doped conductive layer 120 deposited on the surface of the first pyramid structure 11 is high, which is conducive to improving the flatness of a contact interface between the first tunneling layer 110 and the front surface of the substrate 100, reducing the interface state defect of the substrate 100, and improving the mobility of carriers.

It should be understood that the larger the length of each bevel edge of the first pyramid structure 11, the larger an area of each side surface of the first pyramid structure 11, so that the contact area of the first pyramid structure 11 with the first tunneling layer 110 is larger. Based on this, in some embodiments, the length of each bevel edge of the first pyramid structure 11 is in a range of 1.2 μm to 2.5 μm, such as 1.2 μm~1.5 μm, 1.5 μm~1.7 μm, 1.7 μm~1.9 μm, 1.9 μm~2.1 μm, 2.1 μm~2.3 μm, 2.3 μm~2.4 μm, 2.4 μm~2.5 μm, or the like. Within this range, the contact area between the first tunneling layer 110 and the front surface of the substrate 100 is increased while ensuring that the portion of the front surface of the substrate 100 on which the first pyramid structures 11 are disposed has large roughness, thereby further increasing the tunneling channel of the carriers and improving the mobility of the carriers.

Referring to FIGS. 1, 2, 3, and 5, in some embodiments, a plurality of second pyramid structures 12 are disposed in each of the plurality of metal pattern regions, an area proportion of the plurality of first pyramid structures 11 on a portion of the front surface of the substrate 100 in a respective metal pattern region is greater than an area proportion of the plurality of second pyramid structures 12 on the portion of the front surface of the substrate 100 in the respective metal pattern region, and an included angle $\theta_2$ between a respective one of bevel edges of a respective second pyramid structure 12 and a bottom portion of the respective second pyramid structure 12 is in a range of 40° to 70°, such as 40°~45°, 45°~50°, 50°~55°, 55°~60°, 60°~65°, 65°~70°, or the like. The dimension of the second pyramid structure 12 is small, so that the roughness of the portion of the front surface of the substrate 100 in the metal pattern region on which the second pyramid structures 12 are disposed is small. In this way, the roughness of the surface of the first doped conductive layer 120 deposited on the portion of the front surface of the substrate 100 is small, thus the surface of the first doped conductive layer 120 deposited on the portion of the front surface of the substrate 100 has a strong reflection effect on the incident light, which is conducive to reducing the parasitic absorption of the incident light by the first doped conductive layer 120. That is, both the first pyramid structures 11 and the second pyramid structures 12 are provided on the portion of front surface of the substrate 100 in the metal pattern region, which reduces the parasitic absorption of the incident light by the first doped conductive layer 120 while improving the mobility of carriers.

In some embodiments, a one-dimensional dimension of a bottom portion of each of the plurality of second pyramid structures 12 is not greater than 1 μm, and a height from top to bottom of each of the plurality of second pyramid structures 12 is not greater than 1.2 μm. Within this range, the portion of the front surface of the substrate 100 on which the second pyramid structures 12 are disposed has small roughness, so that a top surface of the first doped conductive layer 120 aligned with the second pyramid structures 12 has small roughness, which is conducive to reducing the parasitic absorption of the incident light by the first doped conductive layer 120.

Referring to FIG. 1, in some embodiments, the front surface of the substrate 100 further includes a plurality of non-metal pattern regions, and a plurality of third pyramid structures 14 and a plurality of fourth pyramid structures 15 are disposed in each of the plurality of non-metal pattern regions. A dimension of a bottom portion of each of the plurality of third pyramid structures 14 is greater than a dimension of a bottom portion of each of the plurality of fourth pyramid structures 15, and an area proportion of the plurality of third pyramid structures 14 on a portion of the front surface of the substrate 100 in a respective non-metal pattern region is less than the area proportion of the plurality of first pyramid structures 11 on the portion of the front surface of the substrate 100 in the respective metal pattern region. The area proportion of the plurality of third pyramid structures 14 with the larger dimensions in the non-metal pattern region is arranged to be relatively small, so that the number of the third pyramid structures 14 and the fourth pyramid structures 15 per unit area is larger, thereby enhancing the diffuse reflection effect on the incident light, and reducing the reflectivity on the incident light. In addition, the first doped conductive layer 120 is not provided on the portion of the front surface of the substrate 100 in the non-metal pattern region, which avoids parasitic absorption of the incident light by the first doped conductive layer 120, thereby greatly increasing absorption of the incident light in the non-metal pattern region. In this way, the utilization of the incident light by the substrate 100 is increased while the mobility of the carriers is improved.

In some embodiments, the area proportion of the plurality of third pyramid structures 14 on the portion of the front surface of the substrate 100 in the respective non-metal pattern region is in a range of 50% to 70%, such as 50%~55%, 55%~60%, 60%~65%, 65%~70%, or the like. The area proportion of the plurality of first pyramid structures 11 on the portion of the front surface of the substrate 100 in the respective metal pattern region is in a range of 80% to 90%, such as 80%~82%, 82%~83%, 83%~85%, 85%~87%, 87%~89%, or 89%~90%. Within this range, the diffuse reflection effect on the portion of the front surface of the substrate 100 in the non-metal pattern region is improved while ensuring that the contact interface between the portion of the front surface of the substrate 100 in the metal pattern region and the first tunneling layer 110 has a good morphology, thereby improving the utilization of the incident light.

The number of the third pyramid structures 14 and the number of the fourth pyramid structures 15 on the portion of the front surface of the substrate 100 in the metal pattern region are plural. There may be slight dimensional differences between different third pyramid structures 14 and between different fourth pyramid structures 15, but an overall dimension of each third pyramid structure 14 is approximately close, and an overall dimension of each fourth pyramid structure 15 is approximately close. In should be noted that the dimensions of the plurality of third pyramid structures 14 and the plurality of fourth pyramid structures 15 are average dimensions within a sampling region.

Figure 4:
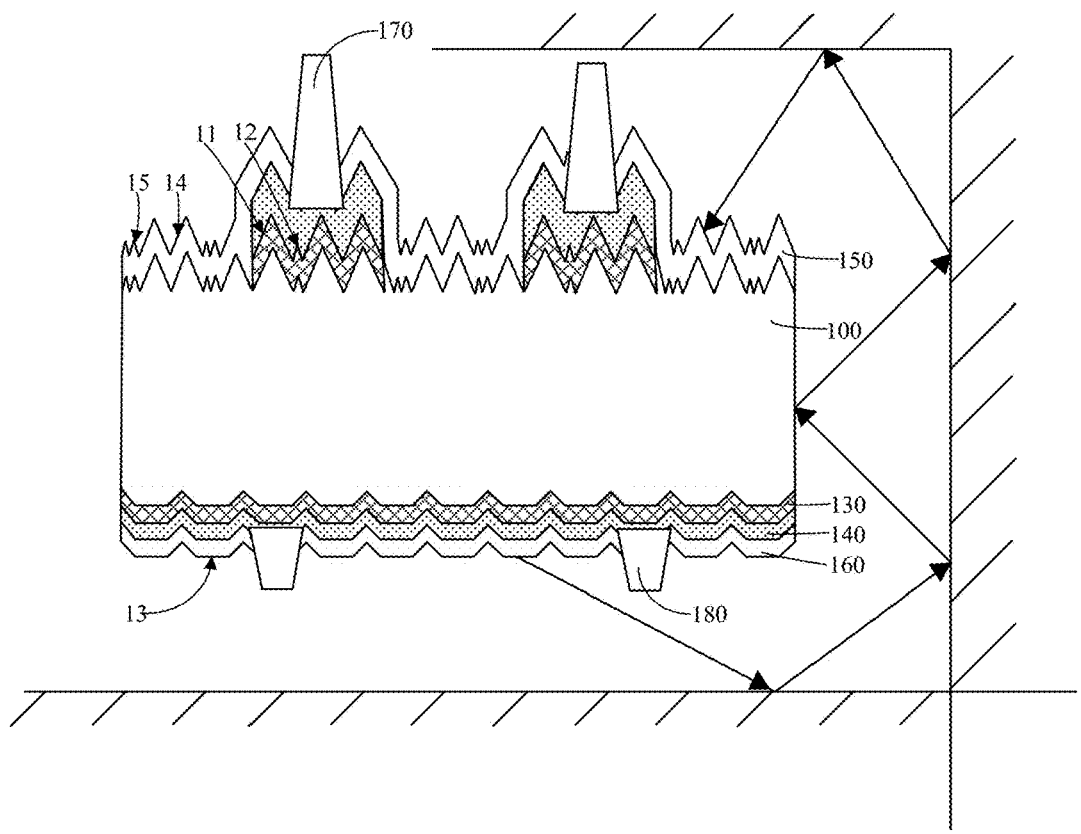
FIG. 4 is a path diagram of incident light reflected on a photovoltaic cell according to an embodiment of the present disclosure.

Referring to FIG. 4, in some embodiments, both the front surface of the substrate 100 and the rear surface of the substrate 100 serve as light receiving surfaces, when the incident light is irradiated to either the front surface of the substrate 100 or the rear surface of the substrate 100, part of the incident light is reflected by the surface of the substrate 100. Specifically, when the incident light is irradiated to one surface of the substrate 100, the reflected part of the incident light is diffracted to the other surface of the substrate 100 through an encapsulation structure covering an outer surface of the photovoltaic cell or the surrounding environment, so as to be re-absorbed and used. For example, due to the low roughness of the rear surface of the substrate 100, the reflectivity of the rear surface of the substrate 100 is large, so that the incident light irradiated to the rear surface of the substrate 100 are easily diffracted to the front surface of the substrate 100, thus the incident light is re-absorbed and used by the front surface of the substrate 100.

That is, the incident light irradiated to the front surface of the substrate 100 is incident into the substrate 100 after multiple reflections between adjacent third pyramid structures 14, between the third pyramid structure 14 and the fourth pyramid structure 15, and between adjacent fourth pyramid structures 15. The more the number of reflection times of the incident light, the less the incident light emitted to the external of the photovoltaic cell, i.e., the more the incident light incident into the substrate 100. The number of reflection times and the reflection angle of the incident light between adjacent third pyramid structures 14, between the third pyramid structure 14 and the fourth pyramid structure 15, and between adjacent fourth pyramid structures 15 is related to the angle between the bevel edge of the third pyramid structure 14 and the bottom portion of the third pyramid structure 14 and the angle between the bevel edge of the fourth pyramid structures 15 and the bottom portion of the fourth pyramid structure 15.

Referring to FIG. 5, in some embodiments, an included angle $\theta_3$ between a respective one of bevel edges of a respective third pyramid structure 14 and a bottom portion of the respective third pyramid structure 14 is in a range of 35° to 65°, such as 40°~45°, 45°~50°, 50°~55°, 55°~60°, 60°~65°, or the like. In some embodiments, an included angle $\theta_4$ between a respective one of bevel edges of a respective fourth pyramid structure 15 and a bottom portion of the respective fourth pyramid structure 15 is in a range of 40° to 65°, such as 40°~45°, 45°~50°, 50°~55°, 55°~60°, 60°~65°, or the like. Within this included angle range, the number of times of the incident light irradiated to the portion of the front surface of the substrate 100 in the non-metal pattern region and the incident light diffracted to the front surface of the substrate 100 again from the rear surface of the substrate 100 reflecting between the adjacent third pyramid structures 14, between the third pyramid structure 14 and the fourth pyramid structure 15 or between the adjacent fourth pyramid structures 15 is large, so that the amount of the incident light emitted to the external of the photovoltaic cell is reduced. In addition, since the area proportion of the third pyramid structures 14 with the larger dimensions in the non-metal pattern region is larger, a total number of the third pyramid structures 14 and the fourth pyramid structures 15 per unit area is greater than that of the first pyramid structures 11 and the second pyramid structures 12 per unit area in the metal pattern region, so that the diffuse reflection effect of the non-metal pattern region is enhanced and the utilization of the incident light is improved.

It should be understood that, when the length of each bevel edge of the third pyramid structure 14 and the length of each bevel edge of the fourth pyramid structure 15 are larger, reflection paths of the incident light on the side surfaces of the third pyramid structure 14 and the fourth pyramid structure 15 are longer, so that the number of reflection times is increased, and the probability that the incident light is emitted to the external of the photovoltaic cell is reduced. Based on this, in some embodiments, a length of each of the bevel edges of the respective third pyramid structure 14 is in a range of 1.2 µm to 2.5 µm, such as 1.2 µm~1.5 µm, 1.5 µm~1.7 µm, 1.7 µm~1.9 µm, 1.9 µm~2.1 µm, 2.1 µm~2.3 µm, 2.3 µm~2.4 µm, 2.4 µm~2.5 µm, or the like. In some embodiments, a length of each of the bevel edges of the respective fourth pyramid structure is in a range of 0.5 µm to 1.2 µm, such as 0.5 µm~0.6 µm, 0.6 µm~0.7 µm, 0.7 µm~0.8 µm, 0.8 µm~0.9 µm, 0.9 µm~1 µm, 1 µm~1.1 µm, 1.1 µm~1.2 µm, or the like. Within this range, the number of reflection times of the incident light between the third pyramid structure 14 and the fourth pyramid structure 15, between the adjacent third pyramid structures 14, and between the adjacent fourth pyramid structures 15 is increased, and the absorption and utilization of the incident light by the portion of the front surface of the substrate 100 in the non-metal pattern region are improved.

Figure 6:
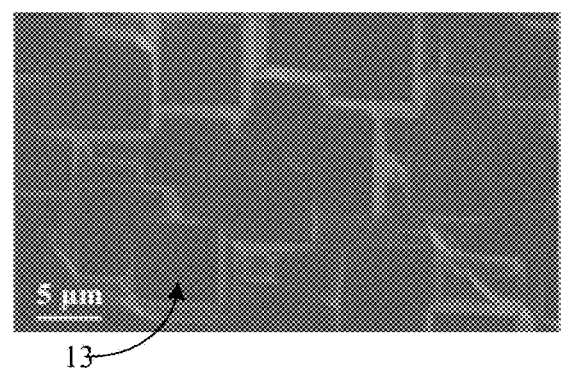
FIG. 6 is a SEM structure graph from a top view of a rear surface of a photovoltaic cell according to an embodiment of the present disclosure.
Figure 7:
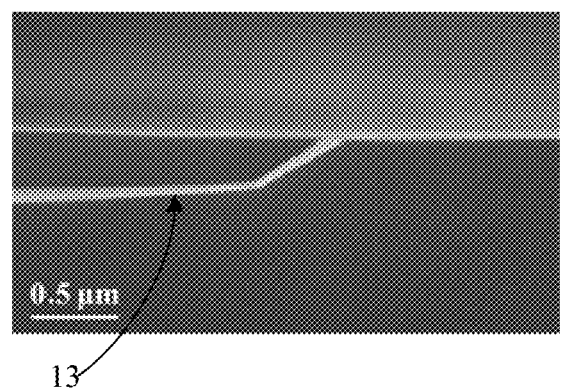
FIG. 7 is a SEM structure graph from a side view of a rear surface of a photovoltaic cell according to an embodiment of the present disclosure.

In some embodiments, the one-dimensional dimension of the bottom portion of each of the plurality of platform protrusion structures 13 is in a range of 6 µm to 10 µm, such as 6 µm~6.5 µm, 6.5 µm~7 µm, 7 µm~8 µm, 8 µm~8.5 µm, 8.5 µm~9 µm, 9 µm~10 µm, or the like. In some embodiments, a height from top to bottom of each of the plurality of platform protrusion structures is in a range of 0.2 µm to 0.4 µm, such as 0.2 µm~0.25 µm, 0.25 µm~0.3 µm, 0.3 µm~0.34 µm, 0.34 µm~0.38 µm, 0.38 µm~0.4 µm, or the like. Specifically, referring to FIGS. 6 to 7, the platform protrusion structure 13 may be a base portion of a pyramid structure, i.e., a remaining portion of the pyramid structure after a spire of the pyramid structure is removed. Within this range, the height from top to bottom of the platform protrusion structure 13 is large, so that the portion of the rear surface of the substrate 100 on which the platform protrusion structures 13 are disposed is able to maintain a certain roughness, thus the reflectivity of the incident light on the rear surface of the substrate 100 is not excessively large as well as the utilization of the incident light by the rear surface of the substrate 100 is not excessively small while ensuring that the second tunneling layer 130 and the second doped conductive layer 140 formed on the rear surface of the substrate 100 have good flatness and uniformity, which is conducive to increasing the open-circuit voltage and the short-circuit current of the photovoltaic cell. In addition, the dimension of the bottom portion of the platform protrusion structure 13 is larger than that of the first pyramid structure 11 on the front surface of the substrate 100, the height of the platform protrusion structure 13 is less than the height of the first pyramid structure 11, so that the roughness of the rear surface of the substrate 100 is smaller than the roughness of the front surface of the substrate 100. Moreover, within this range, the height of the platform protrusion structure 13 is much smaller than the one-dimensional dimension of the bottom portion of the platform protrusion structure 13, so that a morphology of the rear surface of the substrate 100 is nearly flat compared to that of the front surface of the substrate 100, thus the second tunneling layer 130 and the second doped conductive layer 140 formed on the rear surface of the substrate 100 have better uniformity of thicknesses, and the contact surface between the second tunneling layer 130 and the rear surface of the substrate 100 has a good and flat morphology. In this way, the defect state density of the rear surface of the substrate 100 is reduced, so that the mobility of photogenerated carriers generated by the PN junction formed by the second doped conductive layer 140 and the substrate 100 is increased, the concentration of carriers in the substrate 100 is increased, and the open-circuit voltage and the short-circuit current are increased, thereby improving the photoelectric conversion efficiency of the photovoltaic cell.

Figure 8:
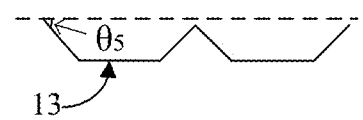
FIG. 8 is an enlarged view of '2' shown in FIG. 1.

It should be appreciated that, in the process of the incident light being reflected from the rear surface of the substrate 100 and then diffracted to the front surface of the substrate 100, the path of the incident light is closely related to the angle between the platform protrusion structures 13 on the rear surface of the substrate 100 and the angle between the adjacent third pyramid structures 14 on the front surface of the substrate 100, the angle between the adjacent fourth pyramid structures 15, and the angle between the third pyramid structure 14 and the fourth pyramid structure 15. Therefore, the angle between the platform protrusion structures 13 is adjusted so that the probability that the incident light reflected by the rear surface of the substrate 100 is diffracted to the front surface of the substrate 100 is large. Based on this, referring to FIG. 8, in some embodiments, an included angle $\theta_5$ between a respective one of bevel edges of a respective platform protrusion structure 13 and a bottom portion of the respective platform protrusion structure 13 is in a range of 10° to 50°, such as 10°~15°, 15°~20°, 20°~25°, 25°~30°, 30°~35°, 35°~40°, 40°~45°, 45°~50°. Within this range, the angle between bevel edges of the two adjacent platform protrusion structures 13 on the rear surface of the substrate 100 is matched with the angle between bevel edges of the two adjacent third pyramid structures 14 on the front surface of the substrate 100, the angle between bevel edges of the adjacent fourth pyramid structures 15 or the angle between the third pyramid structure 13 and the fourth pyramid structure 14, so that the probability that the incident light reflected by the rear surface of the substrate 100 is diffracted to the front surface of the substrate 100 is high, and an incidence angle of the diffracted incident light on side surfaces of the third pyramid structure 13 or side surfaces of the fourth pyramid structure 14 is within an appropriate range, so that the reflectivity of the incident light diffracted to the front surface of the substrate 100 is reduced and the secondary utilization of the incident light by the substrate 100 is improved.

In some embodiments, a length of each of the bevel edges of the respective platform protrusion structure 13 is in a range of 0.3 μm to 2.3 μm, such as 0.3 μm~0.5 μm, 0.5 μm~0.8 μm, 0.8 μm~1 μm, 1 μm~1.2 μm, 1.2 μm~1.5 μm, 1.5 μm~1.8 μm, 1.8 μm~2 μm, 2 μm~2.1 μm, 2.1 μm~2.3 μm, or the like. Within this range, a surface area of the platform protrusion structure 13 is increased while keeping the height of the platform protrusion structure 13 unchanged, which is conducive to increasing the contact area between the second tunneling layer 130 and the rear surface of the substrate 100 and increasing the tunneling channel of the carriers, thereby further improving the mobility of the carriers.

In some embodiments, a reflectivity of the portion of the front surface of the substrate in the respective non-metal pattern region is in a range of 0.8% to 2%, such as 0.8%~0.9%, 0.9%~1%, 1%~1.2%, 1.2%~1.4%, 1.4%~1.6%, 1.6%~1.8%, 1.8%~2%, or the like. In some embodiments, a reflectivity of the rear surface of the substrate is in a range of 14% to 15%, such as 14%~14.1%, 14.1%~14.2%, 14.2%~14.4%, 14.4%~14.6%, 14.6%~14.8%, 14.8%~15%, or the like. Since the texture structures on the portion of the front surface of the substrate 100 in the non-metal pattern region are the third pyramid structures 14 and the fourth pyramid structures 15, the reflectivity of the portion of the front surface of the substrate 100 in the non-metal pattern region is much smaller than the reflectivity of the rear surface of the substrate 100, which is conducive to enhancing the utilization of the incident light by the portion of the front surface of the substrate 100 in the non-metal pattern region, thereby increasing the number of carriers, increasing the short-circuit current and the open-circuit voltage, and improving the photoelectric conversion performance of the photovoltaic cell. However, in practical application, the incident light irradiated to the rear surface of the substrate 100 is less than the incident light irradiated to the front surface of the substrate 100. In this way, the rear surface of the substrate 100 with high reflectivity is provided, which improves the flatness of the rear surface of the substrate 100, so that uniformity and flatness of the second tunneling layer 130 and the second doped conductive layer 140 formed on the rear surface of the substrate 100 are improved, thereby improving the mobility of carriers. Moreover, even if the reflectivity of the rear surface of the substrate 100 is high, based on the arrangement of the included angle between the bevel edge and the bottom portion of the platform protrusion structure 13, the arrangement of the included angle between the bevel edge and the bottom portion of the third pyramid structure 14 on the front surface of the substrate 100, and the arrangement of the included angle between the bevel edge and the bottom portion of the fourth pyramid structure 15 on the rear surface of the substrate 100, the probability that the incident light reflected from the rear surface of the substrate 100 is diffracted again to the front surface of the substrate 100 is high, so that the incident light is able to be used by the front surface of the substrate 100 with a low reflectivity, and the utilization of the incident light is increased while the mobility of carriers is improved.

In some embodiments, the photovoltaic cell further includes a first passivation layer 150, a first portion of the first passivation layer 150 is disposed on a surface of the first doped conductive layer 120 away from the substrate 100, and a second portion of the first passivation layer 150 is disposed on the portion of the front surface of the substrate 100 in the respective non-metal pattern region. The first passivation layer 150 has a good passivation effect on the front surface of the substrate 100. For example, the first passivation layer 150 may chemically passivate the suspension bonds on the front surface of the substrate 100, reduce the defect state density of the front surface of the substrate 100, and suppress the carrier recombination on the front surface of the substrate 100. The first portion of the first passivation layer 150 is directly in contact with the front surface of the substrate 100 such that there is no first tunneling layer 110 and first doped conductive layer 120 between the first portion of the first passivation layer 150 and the substrate 100, thereby reducing the parasitic absorption of the incident light by the first doped conductive layer 120.

In some embodiments, the first portion of the first passivation layer 150 is not flush with the second portion of the first passivation layer 150. Specifically, a top surface of the first portion of the first passivation layer 150 may be lower than a top surface of the second portion of the first passivation layer 150, so that a thickness of the first portion disposed on the front surface of the substrate 100 is not excessively thick, thereby preventing the front surface of the substrate 100 from generating more carrier recombination centers due to too many interface state defects on the front surface of the substrate 100 which are generated from the stress damage caused by the large thickness of the first portion to the front surface of the substrate 100.

In some embodiments, the first passivation layer 150 may be a single-layer structure. In some embodiments, the first passivation layer 150 may also be a multi-layer structure. In some embodiments, the material of the first passivation layer 150 may be at least one of silicon oxide, aluminum oxide, silicon nitride, or silicon oxynitride.

In some embodiments, the photovoltaic cell further includes a second passivation layer 160 for covering a surface of the second doped conductive layer 140 away from the substrate 100. The second passivation layer 160 has a good passivation effect on the rear surface of the substrate 100, which reduces the defect state density on the rear surface of the substrate 100, and suppresses the carrier recombination on the rear surface of the substrate 100. Due to the small concave-convex degree of the platform protrusion structures 13 on the rear surface of the substrate 100, the second passivation layer 160 deposited on the rear surface of the substrate 100 has high flatness, thereby improving the passivation performance of the second passivation layer 160.

In some embodiments, the second passivation layer 160 may be a single-layer structure. In some embodiments, the second passivation layer 160 may also be a multi-layer structure. In some embodiments, the material of the second passivation layer 160 may be at least one of silicon oxide, aluminum oxide, silicon nitride, or silicon oxynitride.

In some embodiments, the photovoltaic cell further includes a first electrode 170 disposed in the respective metal pattern region and electrically connected to the first doped conductive layer 120. The PN junction formed on the rear surface of the substrate 100 is used to receive the incident light and generate photogenerated carriers, and the generated photogenerated carriers are transmitted from the substrate 100 to the first doped conductive layer 120 and then to the first electrode 170 for collecting the photogenerated carriers. Since the doping element type of the first doped conductive layer 120 is the same as the doping element type of the substrate 100, recombination loss of the metal contact between the first electrode 170 and the first doped conductive layer 120 is reduced, so that the carrier contact recombination between the first electrode 170 and the first doped conductive layer 120 is reduced, and the short-circuit current and the photoelectric conversion performance of the photovoltaic cell are improved.

Figure 9:
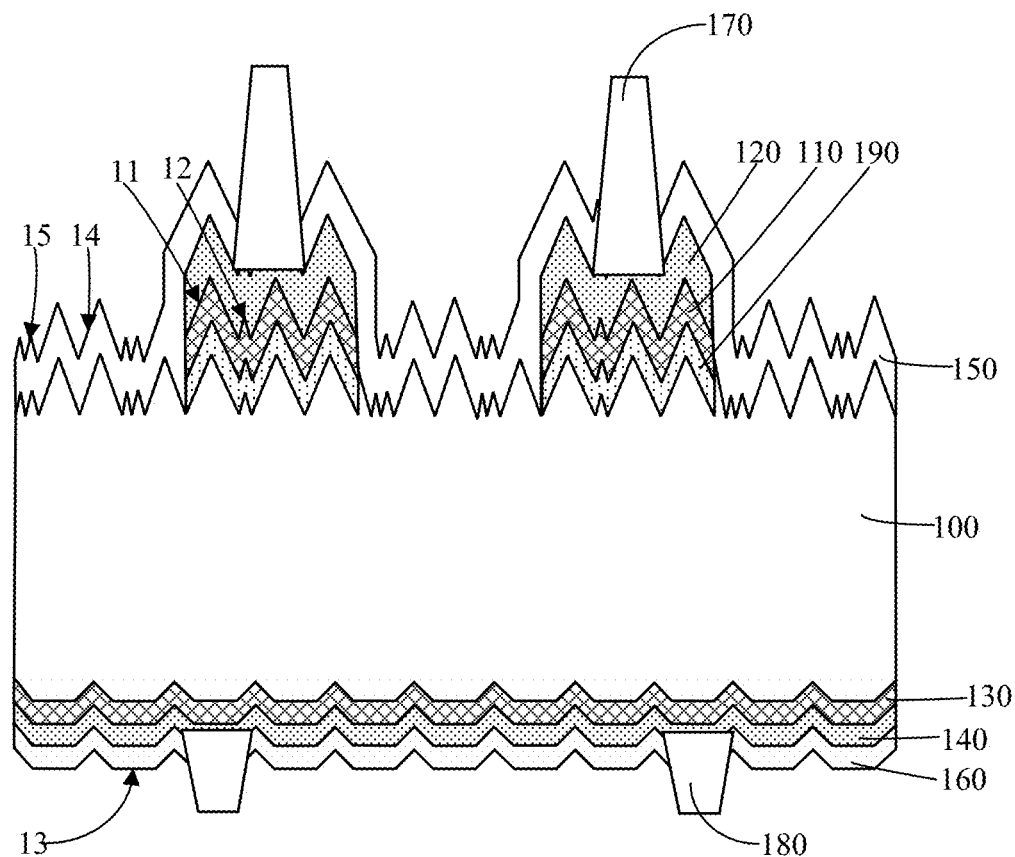
FIG. 9 is another schematic cross-sectional view of a photovoltaic cell according to an embodiment of the present disclosure.

Referring to FIG. 9, in some embodiments, the photovoltaic cell further includes a diffusion region 190 disposed inside a portion of the substrate 100 in the respective metal pattern region, a top portion of the diffusion region 190 is in contact with the first tunneling layer 110, and a doping element concentration of the diffusion region 190 is greater than a doping element concentration of the substrate 100. The diffusion region 190 may serve as a channel for carrier transmission, and the diffusion region 190 is formed only in the portion of the substrate 100 in the metal pattern region, so that carriers in the substrate 100 are easily transmitted into the doped conductive layer through the diffusion region 190, i.e., the diffusion region 190 functions as a channel for carrier transmission. In addition, since the diffusion region 190 is provided only in the portion of the substrate 100 in the metal pattern region, the carriers in the substrate 100 are able to be concentratedly transmitted to the diffusion region 190 and then to the first doped conductive layer 120 via the diffusion region 190, so that the carrier concentration of the first doped conductive layer 120 is greatly increased. It should be noted that in the embodiments of the present disclosure, the diffusion region 190 is not provided in the portion of the substrate 100 in the non-metal pattern region, so that the carrier concentration of the portion of the front surface of the substrate 100 in the non-metal pattern region is not excessively large, and serious carrier recombination on the portion of the front surface of the substrate 100 in the non-metal pattern region is avoided. Moreover, the carriers in the substrate 100 is also prevented from being transmitted to the portion of the front surface of the substrate 100 in the non-metal pattern region, thereby avoiding excessive carrier recombination due to the 'dead layer' generated on the portion of the front surface of the substrate 100 in the non-metal pattern region caused by accumulation of the carriers on the portion of the front surface of the substrate 100 in the non-metal pattern region, thereby improving the overall photoelectric conversion performance of the photovoltaic cell.

In some embodiments, the photovoltaic cell further includes a second electrode 180 disposed on the rear surface of the substrate 100, the second electrode 180 penetrates through the second passivation layer 160 and electrically contacts the second doped conductive layer 140.

In the photovoltaic cell provided in the above embodiments, the first pyramid structures 11 are provided on the portion of the front surface of the substrate 100 in the metal pattern region, and the platform protrusion structures 13 are provided on the rear surface of the substrate 100, so that the roughness of the front surface is greater than the roughness of the rear surface. In this way, on the one hand, the absorption of the incident light by the front surface is enhanced. On the other hand, a contact area between the first tunneling layer 110 and the front surface of the substrate 100 and a contact area between the first doped conductive layer 120 and the front surface of the substrate 100 are increased, so as to provide a large tunneling channel for carriers in the substrate, thereby improving utilization of the incident light by the substrate 100 without reducing the mobility of carriers. In addition, since the second doped conductive layer 140 and the substrate 100 form a PN junction, the roughness of the rear surface is relatively small, so that the second tunneling layer 130 and the second doped conductive layer 140 disposed on the rear surface have greater flatness. Thus, a contact interface between the second tunneling layer 130 and the rear surface of the substrate 100 has a good morphology, the defect state density of the rear surface of the substrate 100 is reduced, and a probability of recombination of photogenerated carriers on the rear surface of the substrate 100 is reduced, so that the mobility of the photogenerated carriers to the substrate 100 is increased, which is conducive to improving a concentration of the carriers, thereby improving photoelectric conversion performance of the photovoltaic cell.

Figure 10:
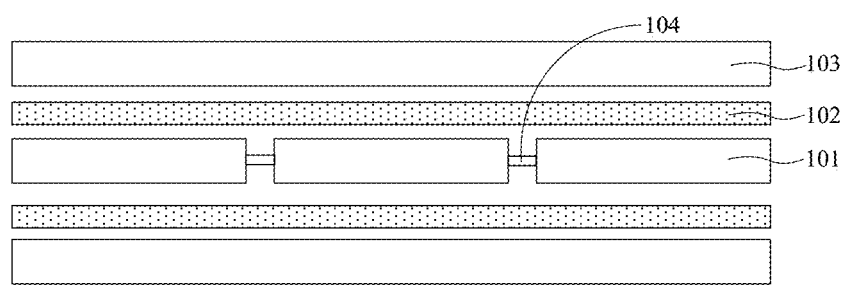
FIG. 10 is a schematic structural diagram of a photovoltaic module according to another embodiment of the present disclosure.

Accordingly, some embodiments of the present disclosure further provide a photovoltaic module. As shown in FIG. 10, the photovoltaic module includes at least one cell string each formed by a plurality of photovoltaic cells 101 provided in the above embodiments which are electrically connected, at least one encapsulation layer 102 each for covering a surface of a respective cell string, and at least one cover plate 103 each for covering a surface of a respective encapsulation layer 102 facing away from the respective cell string. The photovoltaic cells 101 are electrically connected in whole or in pieces to form a plurality of cell strings electrically connected in series and/or in parallel.

Specifically, in some embodiments, the plurality of cell strings may be electrically connected to each other by conductive tapes 104. The encapsulation layer 102 covers the front surface and the rear surface of the photovoltaic cell 101. Specifically, the encapsulation layer 102 may be an organic encapsulation adhesive film such as an ethylene-vinyl acetate copolymer (EVA) adhesive film, a polyethylene octene co-elastomer (POE) adhesive film, a polyethylene terephthalate (PET) adhesive film, or the like. In some embodiments, the cover plate 103 may be a glass cover plate, a plastic cover plate, or the like having a light transmitting function. Specifically, the surface of the cover plate 103 facing towards the encapsulation layer 102 may be a concavo-convex surface, thereby increasing utilization of the incident light.

Although the present disclosure is disclosed in the above embodiments, the present disclosure is not intended to limit the claims. Any person skilled in the art may make several possible changes and modifications without departing from the concept of the present disclosure. Therefore, the protection scope of the present disclosure shall be subject to the scope defined in the claims of the present disclosure.

Those of ordinary skill in the art should appreciate that the embodiments described above are specific embodiments of the present disclosure, and in practical application, various changes may be made thereto in form and detail without departing from the spirit and scope of the present disclosure. Any person skilled in the art may make his or her own changes and modifications without departing from the spirit and scope of the present disclosure. Therefore, the protection scope of the present disclosure shall be subject to the scope limited by the claims.

What is claimed is:

1. A photovoltaic cell comprising:
    a substrate having a front surface and a rear surface opposite to each other, wherein the front surface of the substrate has a plurality of metal pattern regions;
    a first tunneling layer formed on a portion of the front surface of the substrate in a respective metal pattern region of the plurality of metal pattern regions and a first doped conductive layer stacked over the first tunneling layer; and
    a second tunneling layer formed on the rear surface of the substrate and a second doped conductive layer stacked over the second tunneling layer, wherein a doping element type of the second doped conductive layer is different from the doping element type of the first doped conductive layer;
    wherein the front surface has a roughness greater than a roughness of the rear surface;
    wherein both the front surface and the rear surface are textured and configured to receive incident or reflected light.

2. The photovoltaic cell according to claim 1, wherein the front surface has a plurality of non-metal pattern regions, and the roughness of the front surface at the plurality of metal pattern regions is different from the roughness of the front surface at the plurality of non-metal pattern regions.

3. The photovoltaic cell according to claim 2, wherein the front surface is disposed with a plurality of first pyramid structures in each of the plurality of metal pattern regions and the rear surface is disposed with a plurality of platform protrusion structures;
    a height of each of the plurality of first pyramid structures is greater than a height of each of the plurality of platform protrusion structures, and a one-dimensional dimension of a bottom portion of each of the plurality of first pyramid structures is less than a one-dimensional dimension of a bottom portion of each of the plurality of the platform protrusion structures.

4. The photovoltaic cell according to claim 3, wherein the one-dimensional dimension of the bottom portion of each of the plurality of first pyramid structures is in a range of 0.7 µm to 3 µm, and a height from top to bottom of each of the plurality of first pyramid structures is in a range of 0.5 µm to 3.2 µm.

5. The photovoltaic cell according to claim 3, wherein an included angle between a respective one of bevel edges of a respective first pyramid structure of the plurality of first pyramid structures and a bottom portion of the respective first pyramid structure is in a range of 30° to 70°.

6. The photovoltaic cell according to claim 5, wherein a length of each of the bevel edges of the respective first pyramid structure is in a range of 1.2 µm to 2.5 µm.

7. The photovoltaic cell according to claim 3, wherein the one-dimensional dimension of the bottom portion of each of the plurality of platform protrusion structures is in a range of 6 µm to 10 µm, and a height from top to bottom of each of the plurality of platform protrusion structures is in a range of 0.2 µm to 0.4 µm.

8. The photovoltaic cell according to claim 7, wherein an included angle between a respective one of bevel edges of a respective platform protrusion structure of the plurality of platform protrusion structures and a bottom portion of the respective platform protrusion structure is in a range of 10° to 50°.

9. The photovoltaic cell according to claim 8, wherein a length of each of the bevel edges of the respective platform protrusion structure is in a range of 0.3 µm to 2.3 µm.

10. The photovoltaic cell according to claim 3, wherein the front surface is further disposed with a plurality of second pyramid structures in each of the plurality of metal pattern regions, wherein an area proportion of the plurality of first pyramid structures on a portion of the front surface of the substrate in the respective metal pattern region is greater than an area proportion of the plurality of second pyramid structures on the portion of the front surface of the substrate in the respective metal pattern region, and an included angle between a respective one of bevel edges of a respective second pyramid structure of the plurality of second pyramid structures and a bottom portion of the respective second pyramid structure is in a range of 40° to 70°.

11. The photovoltaic cell according to claim 10, wherein a one-dimensional dimension of a bottom portion of each of the plurality of second pyramid structures is not greater than 1 µm, and a height from top to bottom of each of the plurality of second pyramid structures is not greater than 1.2 µm.

12. The photovoltaic cell according to claim 3, wherein
    the front surface is disposed with a plurality of third pyramid structures and a plurality of fourth pyramid structures in each of the plurality of non-metal pattern regions, wherein a dimension of a bottom portion of each of the plurality of third pyramid structures is greater than a dimension of a bottom portion of each of the plurality of fourth pyramid structures, and an area proportion of the plurality of third pyramid structures on a portion of the front surface of the substrate in a respective non-metal pattern region of the plurality of non-metal pattern regions is less than the area proportion of the plurality of first pyramid structures on the portion of the front surface of the substrate in the respective metal pattern region.

13. The photovoltaic cell according to claim 12, wherein an included angle between a respective one of bevel edges of a respective third pyramid structure of the plurality of third pyramid structures and a bottom portion of the respective third pyramid structure is in a range of 35° to 65°, and an included angle between a respective one of bevel edges of a respective fourth pyramid structure of the plurality of fourth pyramid structures and a bottom portion of the respective fourth pyramid structure is in a range of 40° to 65°.

14. The photovoltaic cell according to claim 13, wherein a length of each of the bevel edges of the respective third pyramid structure is in a range of 1.2 µm to 2.5 µm, and a length of each of the bevel edges of the respective fourth pyramid structure is in a range of 0.5 µm to 1.2 µm.

15. The photovoltaic cell according to claim 12, wherein a reflectivity of the portion of the front surface of the substrate in the respective non-metal pattern region is in a range of 0.8% to 2%, and a reflectivity of the rear surface of the substrate is in a range of 14% to 15%.

16. The photovoltaic cell according to claim 2, further comprising:
   a first passivation layer, including a first portion disposed on a surface of the first doped conductive layer away from the first tunneling layer, and a second portion disposed on the portion of the front surface of the substrate in the plurality of non-metal pattern regions; wherein the first portion is not flush with the second portion.

17. The photovoltaic cell according to claim 1, further comprising a second passivation layer disposed on a surface of the second doped conductive layer away from the substrate.

18. The photovoltaic cell according to claim 1, further comprising a first electrode disposed in the respective metal pattern region and electrically connected to the first doped conductive layer.

19. The photovoltaic cell according to claim 1, further comprising:
   a diffusion region disposed inside a portion of the substrate in the respective metal pattern region, wherein a top portion of the diffusion region is in contact with the first tunneling layer, and a doping element concentration of the diffusion region is greater than a doping element concentration of the substrate.

20. A photovoltaic module comprising:
   at least one cell string, each of the at least one cell string formed by a plurality of photovoltaic cells which are electrically connected;
   at least one encapsulation layer, each of the at least one encapsulation layer configured to cover a surface of a respective cell string; and
   at least one cover plate, each of the at least one cover plate configured to cover a surface of a respective encapsulation layer facing away from the respective cell string;
   wherein each of the plurality of photovoltaic cells includes:
   a substrate having a front surface and a rear surface opposite to each other, wherein the front surface of the substrate has a plurality of metal pattern regions;
   a first tunneling layer and a first doped conductive layer stacked on a portion of the front surface of the substrate in a respective metal pattern region of the plurality of metal pattern regions in a direction away from the substrate; and
   a second tunneling layer and a second doped conductive layer stacked on the rear surface of the substrate in a direction away from the substrate, wherein a doping element type of the second doped conductive layer is different from the doping element type of the first doped conductive layer;
   wherein the front surface has a roughness greater than a roughness of the rear surface;
   wherein both the front surface and the rear surface are textured and configured to receive incident or reflected light.

* * * * *